United States Patent
Hashimoto et al.

(10) Patent No.: US 7,799,672 B2
(45) Date of Patent: Sep. 21, 2010

(54) SEMICONDUCTOR DEVICE AND METHOD FOR MANUFACTURING SAME

(75) Inventors: Junichi Hashimoto, Kanagawa-ken (JP); Mitsuhiro Omura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/545,702

(22) Filed: Aug. 21, 2009

(65) Prior Publication Data
US 2010/0207240 A1 Aug. 19, 2010

(30) Foreign Application Priority Data
Feb. 18, 2009 (JP) ............................... 2009-035030

(51) Int. Cl.
*H01L 21/4763* (2006.01)
*H01L 21/44* (2006.01)

(52) U.S. Cl. ..................... 438/618; 438/622; 438/637; 438/639; 438/672; 438/675; 257/E21.645; 257/E21.679

(58) Field of Classification Search .......... 257/E21.645, 257/E21.679
See application file for complete search history.

(56) References Cited

U.S. PATENT DOCUMENTS

| | | | | |
|---|---|---|---|---|
| 7,045,842 B2 * | 5/2006 | Park et al. | ................... | 257/296 |
| 7,459,774 B2 * | 12/2008 | Kwon et al. | ................. | 257/686 |
| 2001/0045591 A1 * | 11/2001 | Tsunemine et al. | ......... | 257/306 |
| 2007/0252201 A1 * | 11/2007 | Kito et al. | .................... | 257/331 |
| 2008/0064162 A1 * | 3/2008 | Cheng et al. | ................. | 438/245 |
| 2008/0217771 A1 * | 9/2008 | Tomisaka et al. | ........... | 257/737 |
| 2009/0065856 A1 * | 3/2009 | Oyu et al. | .................... | 257/329 |
| 2009/0230458 A1 * | 9/2009 | Ishiduki et al. | ............. | 257/324 |

FOREIGN PATENT DOCUMENTS

JP     2007-266143     10/2007

* cited by examiner

*Primary Examiner*—Charles D Garber
*Assistant Examiner*—Mohsen Ahmadi
(74) *Attorney, Agent, or Firm*—Finnegan, Henderson, Farabow, Garrett & Dunner, L.L.P.

(57) ABSTRACT

A semiconductor device includes: a stacked body with a plurality of conductive layers and a plurality of dielectric layers alternately stacked therein, the stacked body including a staircase structure having the plurality of conductive layers processed into a staircase shape; an interlayer dielectric layer covering the staircase structure; and a contact electrode provided inside a contact hole penetrating through the interlayer dielectric layer, the contact hole penetrating through one of the staircase-shaped conductive layers, the contact electrode being in contact with a sidewall portion of the one of the staircase-shaped conductive layers exposed into the contact hole.

12 Claims, 11 Drawing Sheets

US 7,799,672 B2

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2009-035030, filed on Feb. 18, 2009; the entire contents of which are incorporated herein by reference.

BACKGROUND OF THE INVENTION

1. Field of the Invention

This invention relates to a semiconductor device and a method for manufacturing the same.

2. Background Art

A technique for three-dimensionally arranging memory cells is proposed in, for instance, JP-A-2007-266143(Kokai). In this technique, a plurality of conductive layers, each functioning as a word electrode or control gate in a memory device, and dielectric layers are alternately stacked into a stacked structure. Through holes (memory holes) are formed in the stacked structure, and a charge storage layer is formed on the inner wall of the hole, in which silicon is subsequently buried in a columnar shape.

Furthermore, in the technique disclosed in JP-A-2007-266143(Kokai), the end portions of the conductive layers are formed into a staircase shape, and its step differences are used to form contact holes for connecting upper interconnects to the respective conductive layers by the same etching process.

Each contact hole has a different depth depending on the depth position of the corresponding conductive layer. Here, simultaneous etching of the contact holes different in depth is likely to cause variation in the etching amount (etching depth) of each conductive layer reached by the bottom of the corresponding contact hole. Variation in the etching amount of each conductive layer results in variation in the area of contact with the contact electrode buried in the contact hole. Consequently, contact resistance to the contact electrode is varied between the conductive layers.

SUMMARY OF THE INVENTION

According to an aspect of the invention, there is provided a semiconductor device including: a stacked body with a plurality of conductive layers and a plurality of dielectric layers alternately stacked therein, the stacked body including a staircase structure having the plurality of conductive layers processed into a staircase shape; an interlayer dielectric layer covering the staircase structure; and a contact electrode provided inside a contact hole penetrating through the interlayer dielectric layer, the contact hole penetrating through one of the staircase-shaped conductive layers, the contact electrode being in contact with a sidewall portion of the one of the staircase-shaped conductive layers exposed into the contact hole.

According to an aspect of the invention, there is provided a method for manufacturing a semiconductor device, including: alternately stacking a plurality of conductive layers and dielectric layers to form a stacked body; forming, in the stacked body, a staircase structure having the plurality of conductive layers processed into a staircase shape; forming an interlayer dielectric layer covering the staircase structure; collectively forming a plurality of contact holes penetrating through the interlayer dielectric layer, each of the contact holes penetrating through a corresponding one of the staircase-shaped conductive layers; and providing contact electrodes inside the plurality of contact holes.

DETAILED DESCRIPTION OF THE INVENTION

The semiconductor device according to an embodiment of the invention includes a memory cell array with a plurality of memory cells three-dimensionally arranged therein, and a peripheral circuit formed around the memory cell array. Although the semiconductor is illustratively silicon in the following embodiment, semiconductors other than silicon can also be used.

Figure 1:
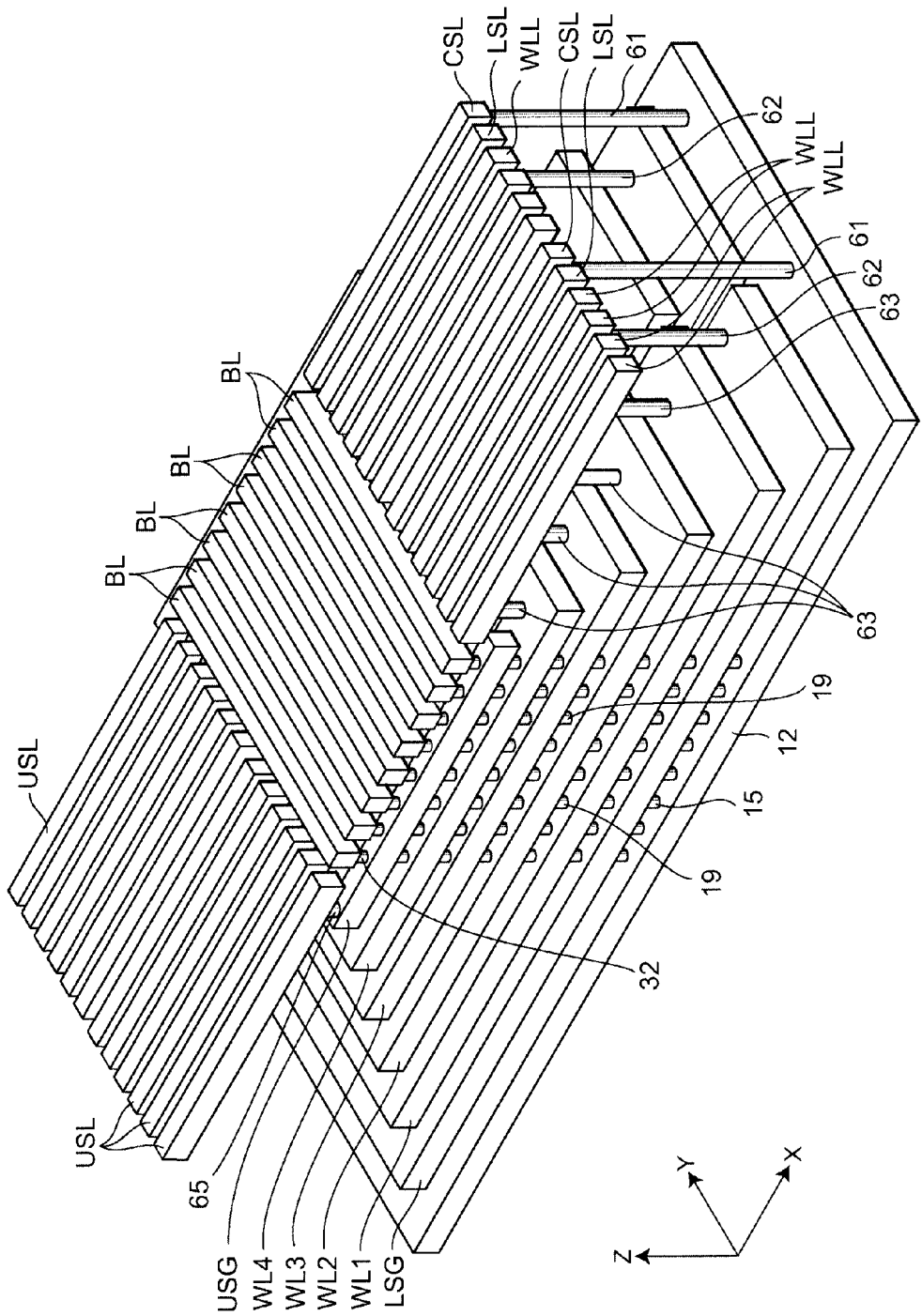
FIG. 1 is a schematic perspective view illustrating the configuration of a memory cell array in a semiconductor device according to an embodiment of the invention.

FIG. 1 is a schematic perspective view illustrating the configuration of the memory cell array.

Figure 2:
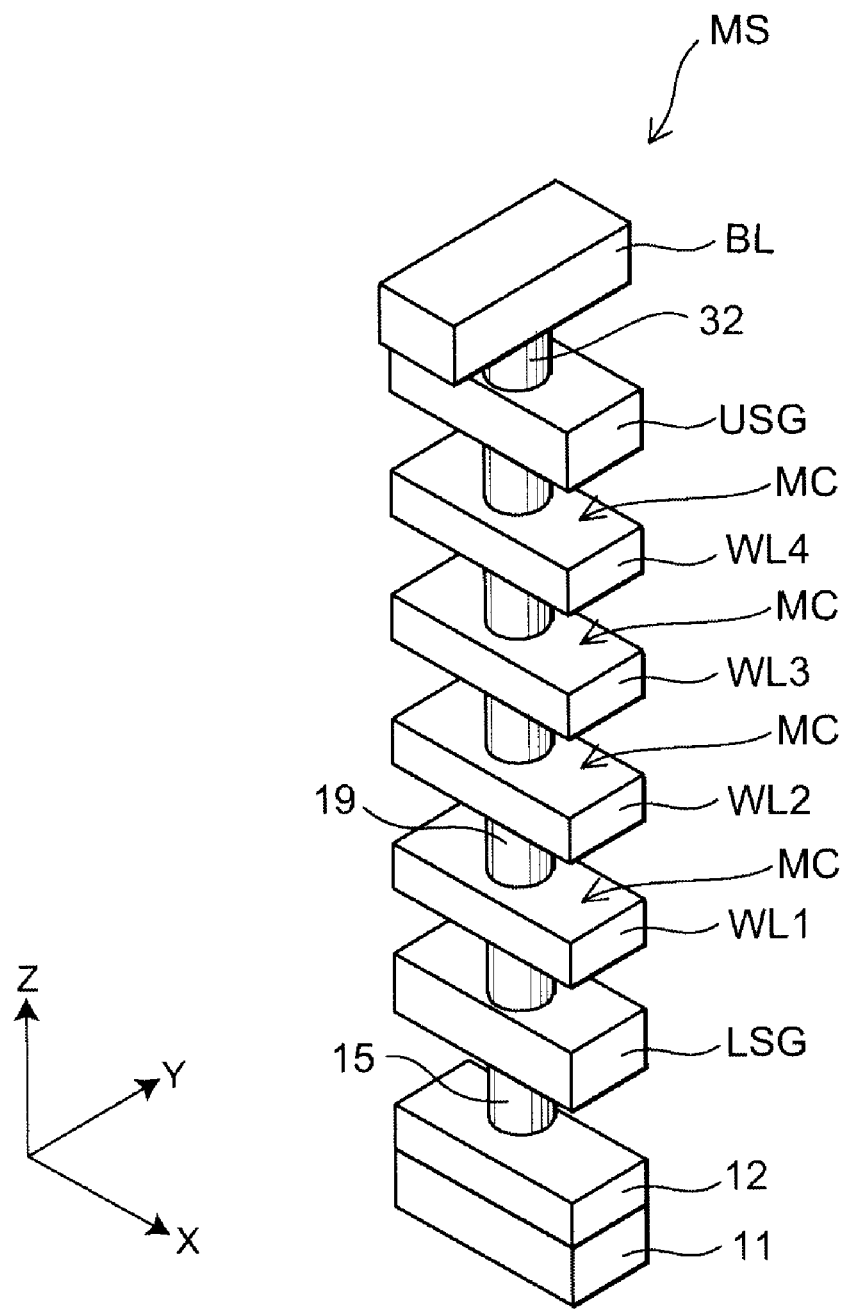
FIG. 2 is a schematic perspective view of one memory string in the memory cell array.

FIG. 2 is a schematic perspective view of one memory string in which a plurality of memory cells are series connected in a stacking direction of a plurality of conductive layers functioning as word electrode layers.

Figure 3:
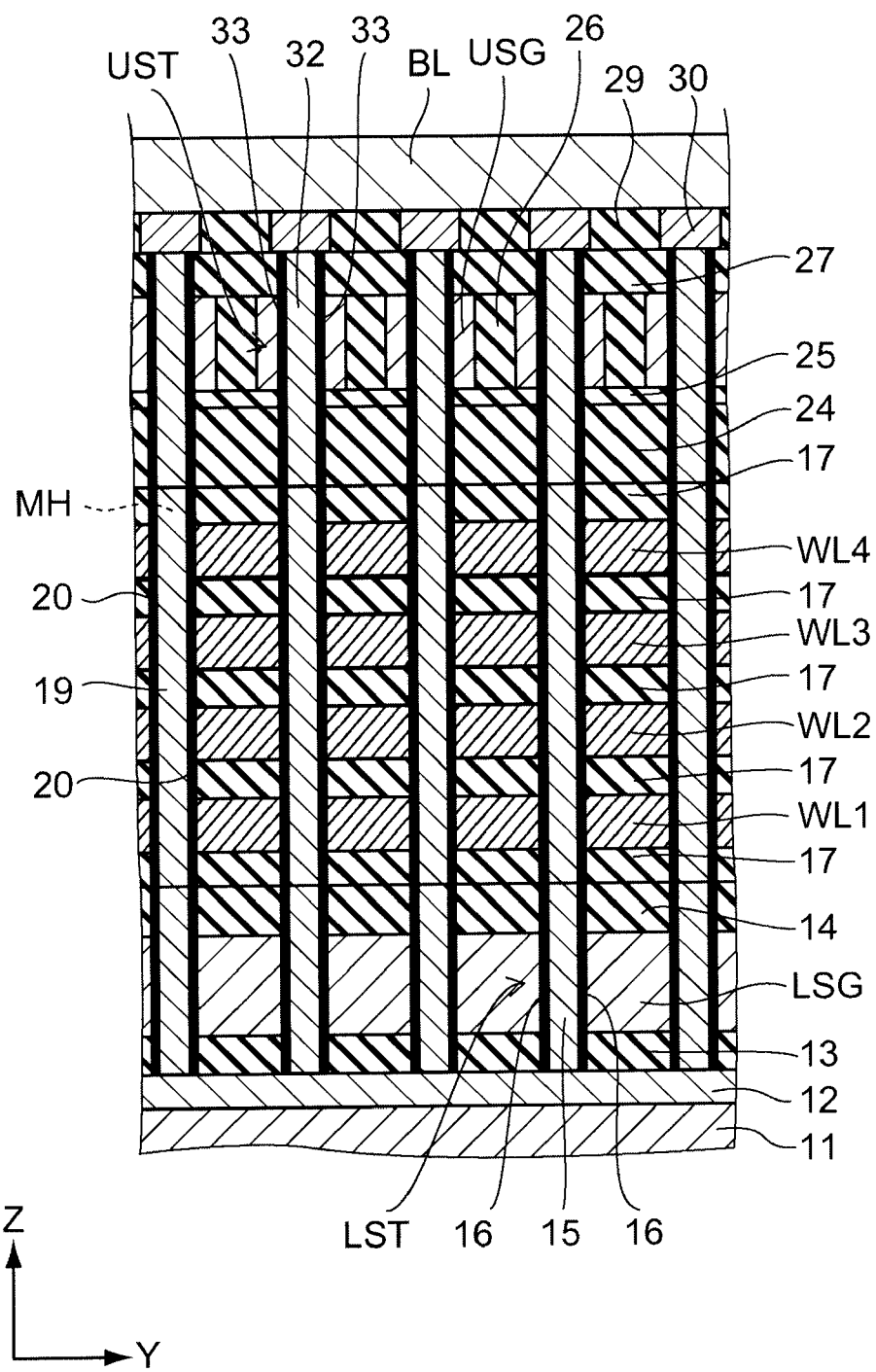
FIG. 3 is a principal schematic cross-sectional view of the memory cell array in the YZ direction in FIG. 1.

FIG. 3 is a schematic cross-sectional view of the memory cell array in the YZ direction in FIG. 1.

In FIGS. 1 and 2, for clarity of illustration, only conductive portions are shown, and dielectric portions are not shown.

In this specification, an XYZ orthogonal coordinate system is introduced for convenience of description. In this coordinate system, two directions parallel to a major surface of a substrate and orthogonal to each other are referred to as the X and Y direction, and a direction orthogonal to both the X and Y direction, that is, the stacking direction of the plurality of conductive layers WL1-WL4, is referred to as the Z direction.

As shown in FIG. 3, a cell source 12 is provided on a substrate 11 (such as a silicon substrate). The cell source 12 is a silicon layer doped with impurities and being conductive. A lower select gate LSG is provided above the cell source 12 via a dielectric layer 13, and a dielectric layer 14 is provided on the lower select gate LSG. The dielectric layers 13, 14 are layers including silicon oxide or silicon nitride. The lower select gate LSG is a silicon layer doped with impurities and being conductive.

On the dielectric layer 14 is provided a stacked body in which a plurality of dielectric layers 17 and the plurality of conductive layers WL1-WL4 are alternately stacked. The number of conductive layers WL1-WL4 is arbitrary, and illustratively four in this embodiment. The dielectric layer 17 includes silicon oxide, such as TEOS (tetraethoxysilane) (Si(OC$_2$H$_5$)$_4$). The conductive layers WL1-WL4 are silicon layers doped with impurities and being conductive, which have a generally equal thickness.

A stopper layer (such as a SiN layer) 24 is provided above the uppermost conductive layer WL4 via the uppermost dielectric layer 17, an upper select gate USG is provided above the stopper layer 24 via a dielectric layer 25, and a dielectric layer 27 is provided on the upper select gate USG. The dielectric layers 25, 27 are layers including silicon oxide or silicon nitride. The upper select gate USG is a silicon layer doped with impurities and being conductive.

As shown in FIGS. 1 and 3, the conductive layers WL1-WL4, the lower select gate LSG, and the cell source 12 are formed as plate-like layers parallel to the XY plane. The upper select gate USG is formed into a plurality of wiring-like conductive members extending in the X direction. As shown in FIG. 3, a dielectric layer 26 is provided between each pair of upper select gates USG. It is noted that as an alternative configuration, the lower select gate LSG can be divided into a plurality of members like the upper select gate USG.

The aforementioned stacked body on the substrate 11 includes a plurality of memory holes extending in the Z direction. The memory holes are arranged in a matrix along the X and Y direction, for instance.

As shown in FIG. 3, inside each memory hole MH, silicon pillars 15, 19, 32 are buried as columnar semiconductor layers sequentially from bottom. The silicon pillar 15 penetrates through the lower select gate LSG, the silicon pillar 19 penetrates through the plurality of conductive layers WL1-WL4, and the silicon pillar 32 penetrates through the upper select gate USG. The silicon pillars 15, 19, 32 are formed from polycrystalline silicon or amorphous silicon. The silicon pillars 15, 19, 32 are shaped like columns, such as cylinders, extending in the Z direction. The lower end of the silicon pillar 15 is connected to the cell source 12. The lower end of the silicon pillar 19 is connected to the silicon pillar 15, and its upper end is connected to the silicon pillar 32.

A dielectric layer 29 is provided on the dielectric layer 27 on the upper select gate USG, and a plurality of bit lines BL extending in the Y direction are provided on the dielectric layer 29. Each bit line BL is arranged so as to pass immediately above a corresponding sequence of silicon pillars 32 arranged along the Y direction, and is connected to the upper end of the silicon pillar 32 through a contact electrode 30 penetrating through the dielectric layer 29.

As shown in FIG. 1, the upper select gate USG is connected to an upper select gate interconnect USL through a contact electrode 65. The end portion of the stacked body with the cell source 12, the lower select gate LSG, and the plurality of conductive layers WL1-WL4 stacked therein is processed into a staircase shape in which the lower layer protrudes to a larger extent in the X direction. In this staircase structure, the cell source 12 is connected to a cell source interconnect CSL through a contact electrode 61, the lower select gate LSG is connected to a lower select gate interconnect LSL through a contact electrode 62, and each conductive layer WL1-WL4 is connected to a word line WLL through a contact electrode 63.

Figure 4:
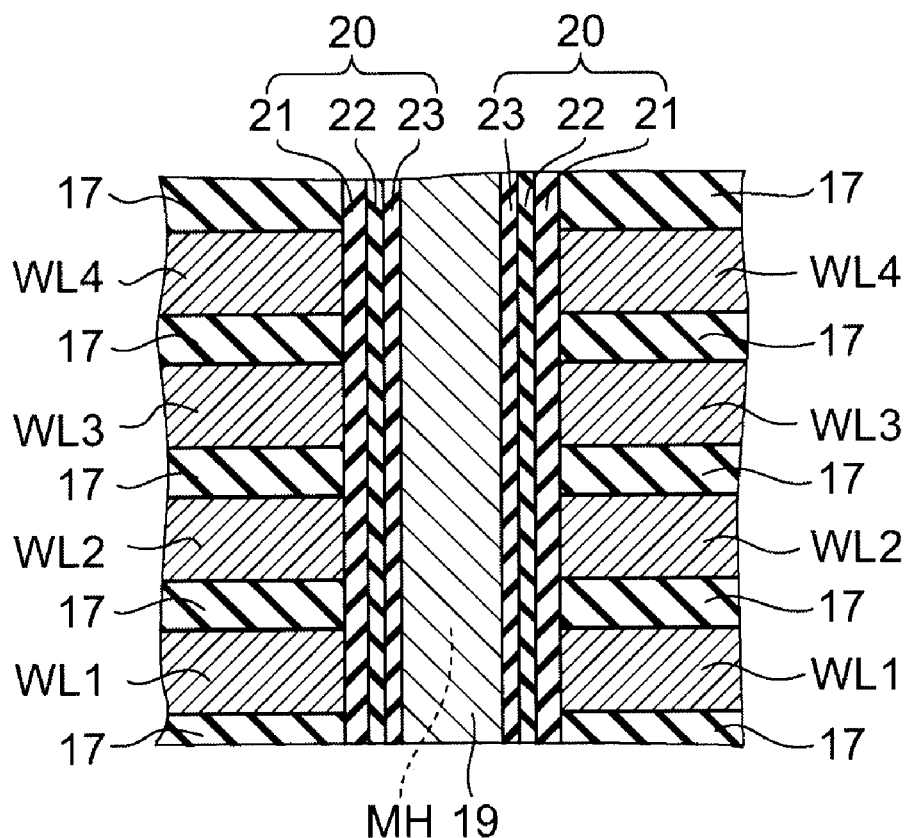
FIG. 4 is an enlarged cross section of the principal portion in FIG. 3.

As shown in FIG. 3, on the inner peripheral wall of the memory hole MH formed in the stacked body of the conductive layers WL1-WL4 and the dielectric layers 17 is formed a dielectric film 20 illustratively having an ONO (oxide-nitride-oxide) structure in which a silicon nitride film is sandwiched between a pair of silicon oxide films. FIG. 4 shows an enlarged cross section of that portion.

The dielectric film 20 has a structure in which a charge storage layer 22 is sandwiched between a first dielectric film 21 and a second dielectric film 23. The silicon pillar 19 is provided inside the second dielectric film 23, and the second dielectric film 23 is in contact with the silicon pillar 19. The first dielectric film 21 is provided in contact with the conductive layers WL1-WL4, and the charge storage layer 22 is provided between the first dielectric film 21 and the second dielectric film 23.

The silicon pillar 19 provided in the stacked body of the conductive layers WL1-WL4 and the dielectric layers 17 functions as a channel, the conductive layers WL1-WL4 function as control gates, and the charge storage layer 22 functions as a data memory layer for storing charges injected from the silicon pillar 19. That is, at the intersection between the silicon pillar 19 and each conductive layer WL1-WL4 is formed a memory cell having a structure in which a channel is surrounded by a control gate.

This memory cell is a memory cell having a charge trap structure. The charge storage layer 22 includes numerous traps operable to confine charges (electrons), and is illustratively made of a silicon nitride film. The second dielectric film 23 is illustratively made of a silicon oxide film and serves as a potential barrier when a charge is injected from the silicon pillar 19 into the charge storage layer 22 or when a charge stored in the charge storage layer 22 diffuses into the silicon pillar 19. The first dielectric film 21 is illustratively made of a silicon oxide film and prevents charges stored in the charge storage layer 22 from diffusing into the conductive layers WL1-WL4.

As shown in FIG. 2, as many memory cells MC as the number of conductive layers WL1-WL4 are series connected in the Z direction around one silicon pillar 19 to constitute one memory string MS. Such memory strings MS are arranged in a matrix in the X and Y direction, and thereby a plurality of memory cells MC are three-dimensionally arranged in the X, Y, and Z direction.

Referring again to FIG. 3, on the inner peripheral wall of the hole formed in the stacked body composed of the lower select gate LSG and its overlying and underlying dielectric layer 13, 14, a gate dielectric film 16 is formed in a tubular shape, and the silicon pillar 15 is buried therein. Thus, this stacked body includes a lower select transistor LST with the silicon pillar 15 serving as a channel and the lower select gate LSG therearound serving as a gate electrode.

Furthermore, on the inner peripheral wall of the hole formed in the stacked body composed of the stopper layer 24, the upper select gate USG, and its overlying and underlying dielectric layer 25, 27, a gate dielectric film 33 is formed in a tubular shape, and the silicon pillar 32 is buried therein. Thus, this stacked body includes an upper select transistor UST with the silicon pillar 32 serving as a channel and the upper select gate USG therearound serving as a gate electrode.

Around the memory cell array described above, a peripheral circuit, not shown, is formed in the same substrate 11. The peripheral circuit illustratively includes a driver circuit for applying a potential to the upper end portion of the silicon pillar 32 through a bit line BL, a driver circuit for applying a potential to the lower end portion of the silicon pillar 15 through the cell source interconnect CSL and the cell source 12, a driver circuit for applying a potential to the upper select gate USG through the upper select gate interconnect USL, a driver circuit for applying a potential to the lower select gate LSG through the lower select gate interconnect LSL, and a driver circuit for applying a potential to each conductive layer WL1-WL4 through the word line WLL.

The semiconductor device according to this embodiment is a nonvolatile semiconductor memory device allowing data to be erased and programmed electrically and freely, and being capable of retaining its memory content even when powered off.

The X coordinate of a memory cell is selected by selecting a bit line BL, the Y coordinate of the memory cell is selected by selecting an upper select gate USG to turn the upper select transistor UST to the conducting or non-conducting state, and the Z coordinate of the memory cell is selected by selecting a word line WLL, that is, one of the conductive layers WL1-WL4. Then, data is stored by injecting electrons into the charge storage layer 22 of the selected memory cell. The data stored in the memory cell is read by passing a sense current in the silicon pillar 19 which passes through the memory cell.

In the above semiconductor device, as shown in FIG. 1, the end portions of the conductive layers WL1-WL4 outside the memory cell array region are processed into a staircase shape in which the lower layer has a longer length from the memory cell array region. Thus, contact holes for connecting the respective conductive layers WL1-WL4 to the upper word line WLL can be collectively formed by the same etching process.

In the following, a method for manufacturing the semiconductor device according to this embodiment is described with reference to FIGS. 5 to 10. Here, the stacked body of the dielectric layers 17 and the conductive layers WL1-WL4 is extracted for description. The description of the method for forming the stacked body including the lower select transistor LST and the stacked body including the upper select transistor UST is omitted.

A plurality of dielectric layers 17 and a plurality of conductive layers WL1-WL4 are alternately stacked illustratively by the CVD (chemical vapor deposition) method to form a stacked body thereof.

After the aforementioned stacked body is formed, the memory array region is subjected to a process for forming the memory hole MH, the dielectric film 20 including the charge storage layer, the silicon pillar 19 and the like shown in FIG. 3.

Figure 5A:
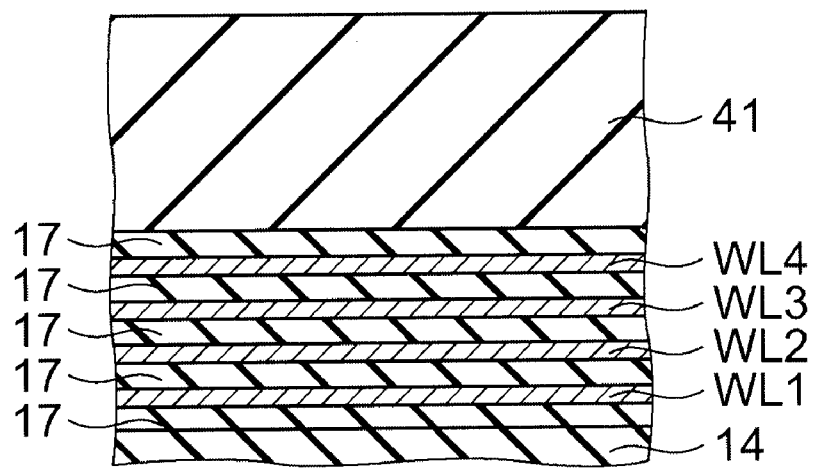
FIGS. 5A and 5B are schematic views showing a manufacturing method of the semiconductor device according to the embodiment of the invention.

Subsequently, on the aforementioned stacked body, a resist film 41 is formed as shown in FIG. 5A to process a staircase structure.

Figure 5B:
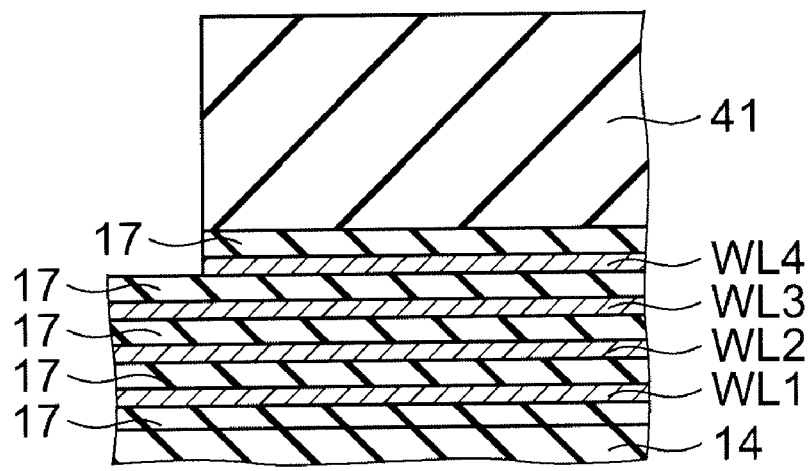

First, the resist film 41 is patterned so that the end of the resist film 41 is located at the lowermost step in the staircase structure, and the resist film 41 is used as a mask to etch the first-step dielectric layer 17 from the top and the conductive layer WL4 by the RIE (reactive ion etching) method, for instance, as shown in FIG. 5B.

Figure 6A:
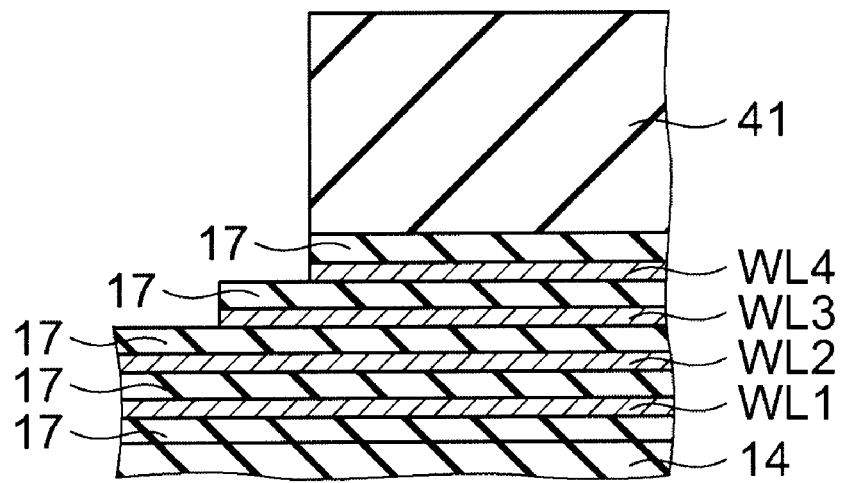
FIGS. 6A and 6B are schematic views showing processes following FIG. 5B.

Next, the RIE method or CDE (chemical dry etching) method based on $O_2$ gas and the like is used to perform resist slimming which reduces the planar size of the resist film 41, and the resist film 41 is used as a mask to etch the stacked body by the RIE method. By this etching, as shown in FIG. 6A, the second-step dielectric layer 17 and the conductive layer WL3 are further removed in the portion where the first-step dielectric layer 17 and the conductive layer WL4 were removed by the previous etching, and the first-step dielectric layer 17 and the conductive layer WL4 are removed in the adjacent portion.

Figure 6B:
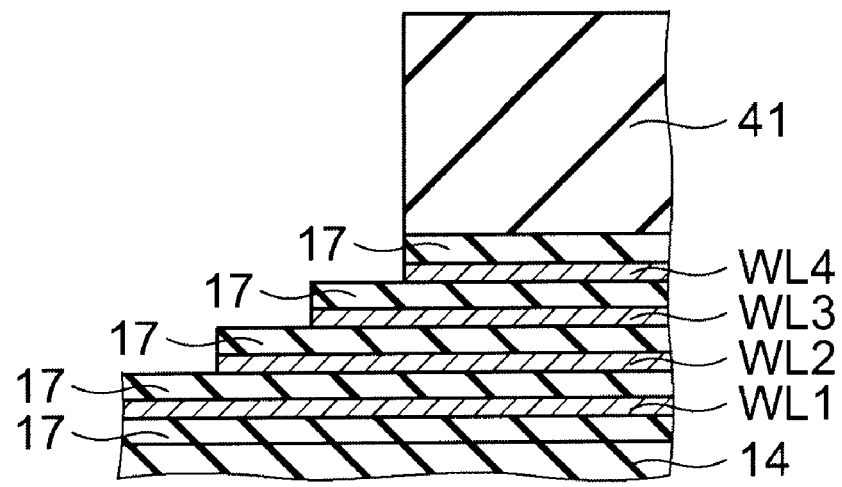
Figure 7A:
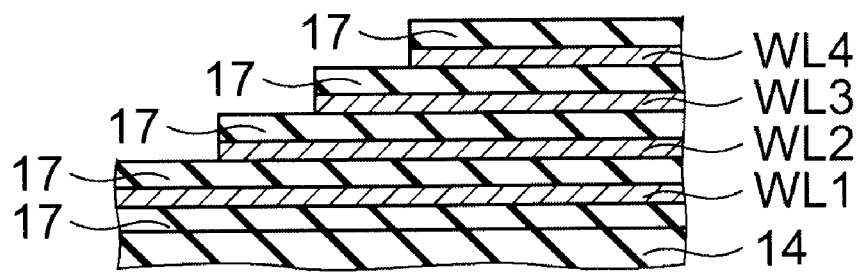
FIGS. 7A and 7B are schematic views showing processes following FIG. 6B.

Subsequently, as shown in FIG. 6B, the resist film 41 is further slimmed, and the dielectric layers 17 and the conductive layers WL1-WL4 in the portion not covered with the resist film 41 are each etched by the amount of one layer. Then, the resist film 41 is removed. Thus, as shown in FIG. 7A, the staircase structure is formed in the stacked body.

Figure 7B:
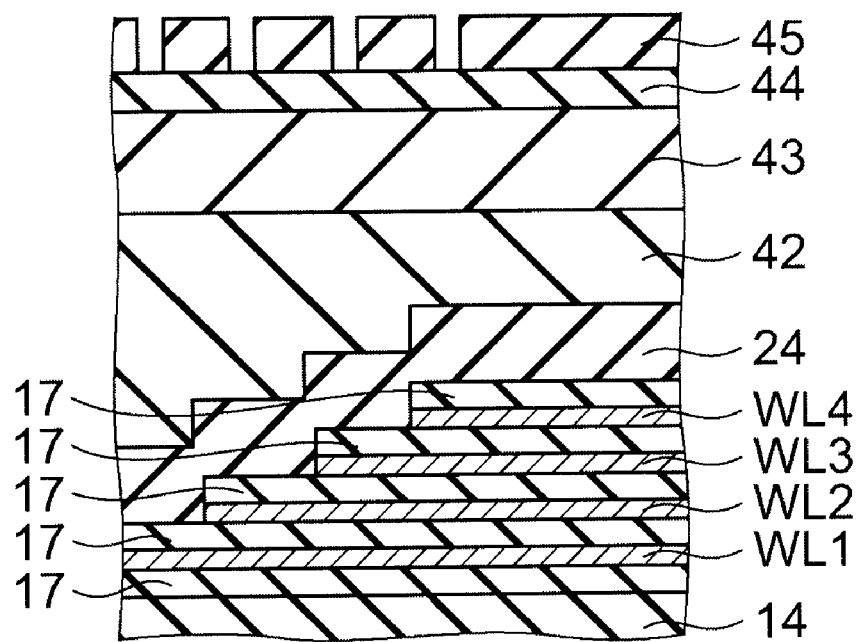

Next, as shown in FIG. 7B, the silicon nitride-based stopper layer 24 is formed on the stacked body so as to cover the staircase structure, and a silicon oxide-based interlayer dielectric layer 42 is further formed on the stopper layer 24. These are illustratively formed by the CVD method. This interlayer dielectric layer 42 corresponds to part of the dielectric layer in the stacked body including the upper select transistor UST shown in FIG. 3.

Next, after the upper surface of the interlayer dielectric layer 42 is planarized, an organic film 43 to serve as a mask in etching the interlayer dielectric layer 42 is formed on the interlayer dielectric layer 42. Furthermore, a silicon oxide film 44 to serve as a mask in etching the organic film 43 is formed on the organic film 43.

Figure 8A:
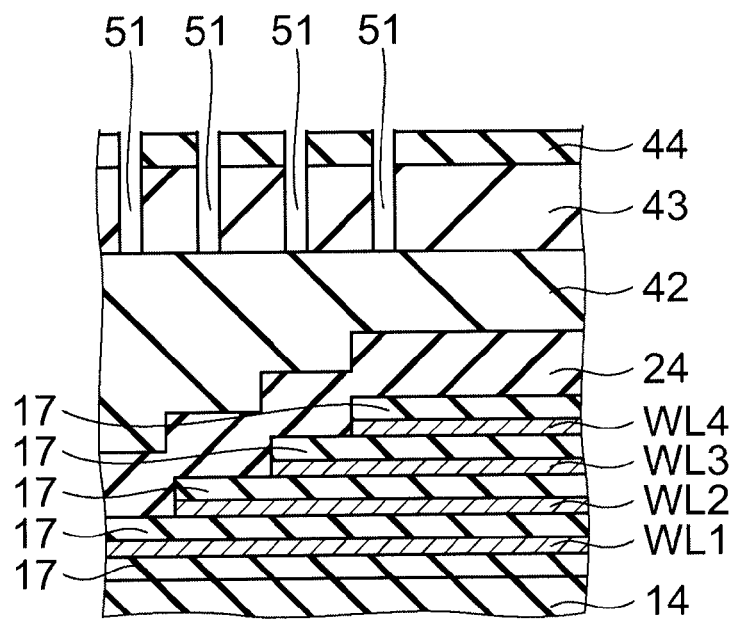
FIGS. 8A and 8B are schematic views showing processes following FIG. 7B.

Next, a resist film 45 is formed on the silicon oxide film 44, and then patterned. The resist pattern is used as a mask to etch the silicon oxide film 44 and the organic film 43 by the RIE method. Thus, as shown in FIG. 8A, in the silicon oxide film 44 and the organic film 43, holes 51 penetrating therethrough are formed. Here, when the organic film 43 is etched, the resist film 45 likewise made of an organic material is also consumed and removed from above the silicon oxide film 44.

Figure 8B:
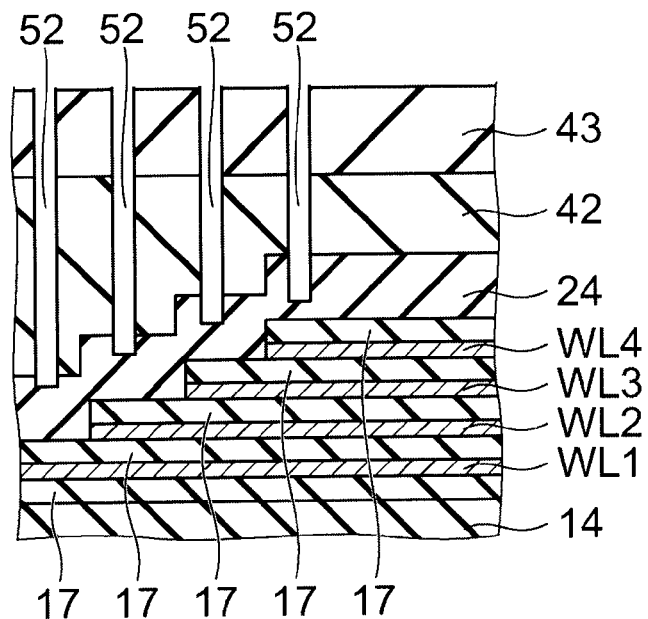
Figure 9A:
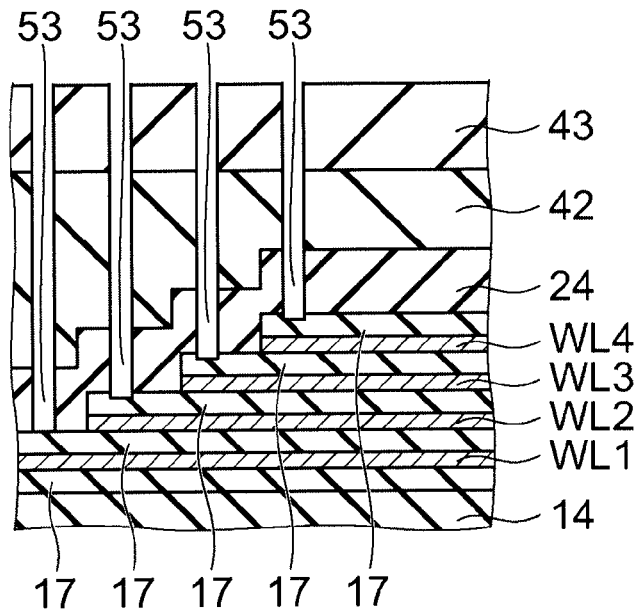
FIGS. 9A and 9B are schematic views showing processes following FIG. 8B.

Next, the organic film 43 is used as a mask to etch the interlayer dielectric layer 42 to form holes 52 penetrating through the interlayer dielectric layer 42 as shown in FIG. 8B. Here, when the silicon oxide-based interlayer dielectric layer 42 is etched, the silicon oxide film 44 is also consumed and removed from above the organic film 43. Subsequently, the stopper layer 24 is etched to form holes 53 penetrating through the stopper layer 24 as shown in FIG. 9A. The etching time for etching them is set so that the hole 53 on the lowermost step of the staircase structure, which is to be formed most deeply, penetrates through the etched layer and reliably reaches the underlying layer.

The interlayer dielectric layer 42 and the stopper layer 24 are both etched by the RIE method using a fluorocarbon gas, for instance. The composition and flow rate of the fluorocarbon gas are controlled so that the silicon oxide-based interlayer dielectric layer 42 is etched with a high etching selection ratio relative to the silicon nitride-based stopper layer 24, and that the stopper layer 24 is etched with a high etching selection ratio relative to the silicon oxide-based dielectric layer 17 therebelow.

Thus, when the interlayer dielectric layer 42 is etched, the stopper layer 24 functions as an etching stopper to reduce processing variation between the holes 52. When the stopper layer 24 is etched, the dielectric layer 17 therebelow functions as an etching stopper to reduce processing variation between the holes 53.

Figure 9B:
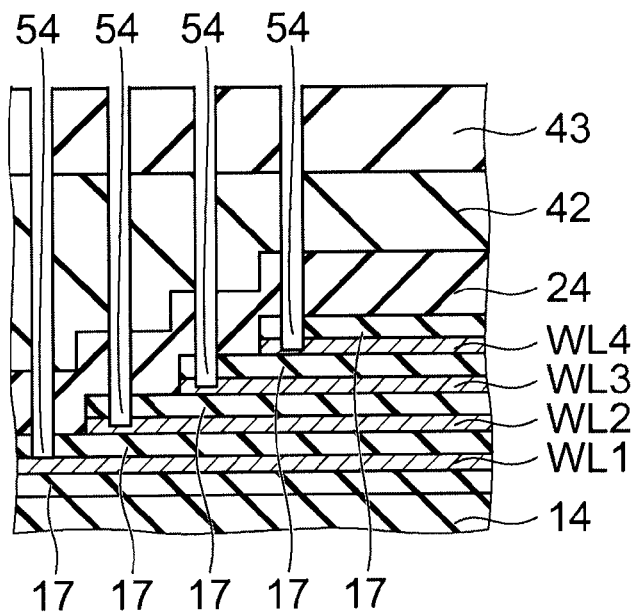

Subsequently, the dielectric layers 17 between the staircase-shaped conductive layers WL1-WL4 and the stopper layer 24 are etched to form holes 54 penetrating through the dielectric layers 17 and reaching the conductive layers WL1-WL4 as shown in FIG. 9B.

Thus, when the holes 54 are formed, a structure in which the silicon nitride-based stopper layer 24 is sandwiched between the dielectric layers 17 and the interlayer dielectric layer 42, both silicon oxide-based, is provided on the staircase-shaped conductive layers WL1-WL4 to reduce processing variation between the holes. Nevertheless, when the numerous holes 54 different in depth are simultaneously etched by the same process, the reached position of the hole bottom is likely to cause variation. Typically, the etching time is set in accordance with the etching time of the hole 54 reaching the conductive layer WL1 located at the deepest position. However, in the holes 54 formed shallower than this hole, the corresponding conductive layers WL2-WL4 tend to be overetched.

That is, as shown in FIG. 9B, in the staircase-shaped conductive layers WL1-WL4 reached by the holes 54, the etching amount tends to be larger in the upper layers located at shallower positions than in the lower layers located at deeper positions. This difference in etching amount translates into the difference in contact area between the contact electrode buried in each hole 54 and the corresponding conductive layer WL1-WL4, causing variation in contact resistance between the contact electrode and the corresponding conductive layer WL1-WL4.

Figure 12:
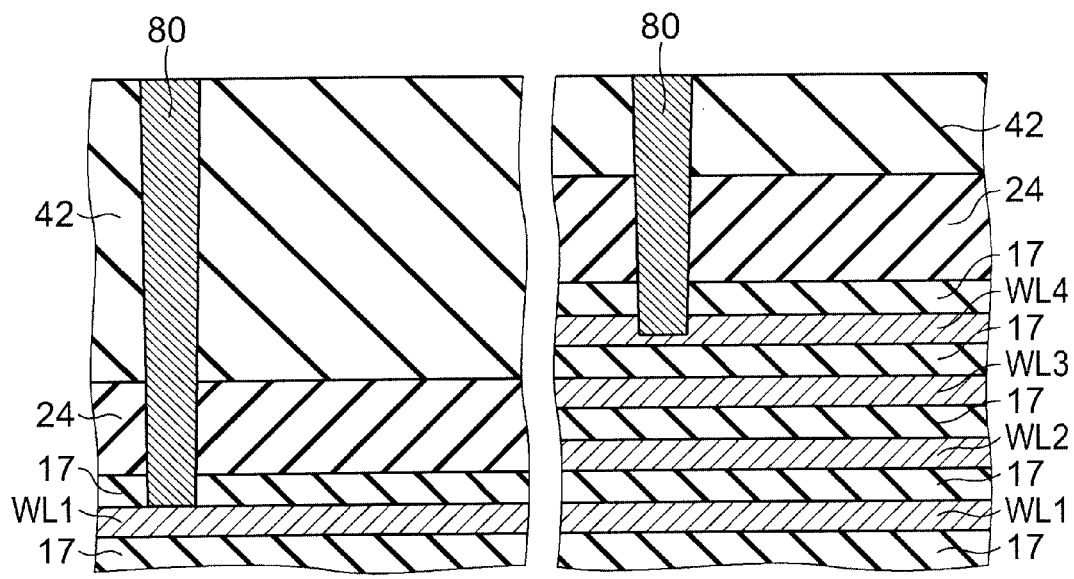
FIG. 12 is a schematic view of a principal portion of a semiconductor device of a comparative example.

FIG. 12 schematically shows, for instance, a contact hole reaching the lowermost conductive layer WL1 and a contact electrode 80 buried therein, and a contact hole reaching the uppermost conductive layer WL4 and a contact electrode 80 buried therein.

With regard to the conductive layer WL1, the contact electrode 80 is in contact therewith only at its bottom surface. However, with regard to the conductive layer WL4, the contact electrode 80 is in contact therewith not only at its bottom surface, but also at its side surface with an area corresponding to the etching amount (etching depth) of the conductive layer WL4. That is, the conductive layer WL4 has a smaller contact resistance to the contact electrode 80 than the conductive layer WL1, and this difference may lead to difference in characteristics between the memory cell with the conductive layer WL4 serving as a control gate and the memory cell with the conductive layer WL1 serving as a control gate.

Figure 10A:
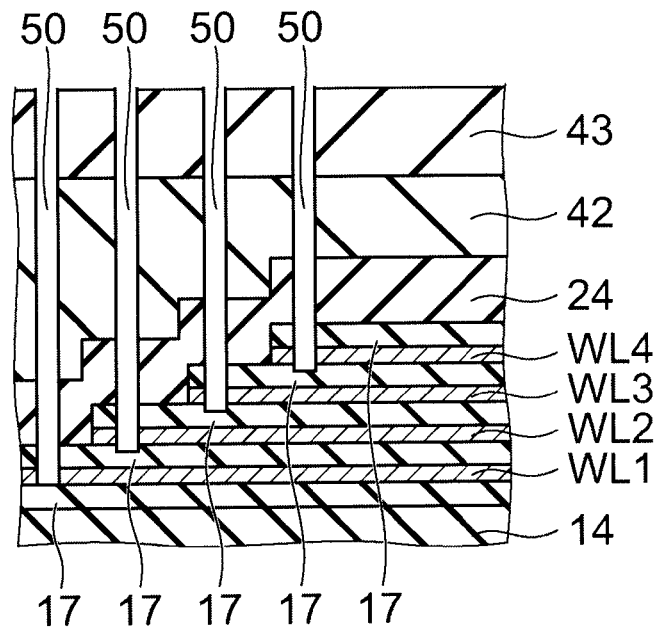
FIGS. 10A and 10B are schematic views showing processes following FIG. 9B.

Thus, in this embodiment, after the process of FIG. 9B, etching is further performed until the conductive layers WL1-WL4 are each penetrated by the amount of one layer as shown in FIG. 10A. In the conductive layers WL1-WL4, each being a silicon layer, the portion bordering the holes 54 shown in FIG. 9B is etched by the RIE method using a gas containing a halogen element, such as a gas containing at least one of $Cl_2$, HBr, and $BCl_3$. Here, the silicon oxide-based dielectric layer 17 therebelow functions as an etching stopper. The etching time is set so that the conductive layer WL1 located at the deepest position is completely penetrated.

By the processes described above, contact holes 50 penetrating through the interlayer dielectric layer 42, the stopper layer 24, the staircase-shaped dielectric layers 17, and the conductive layers WL1-WL4 are collectively formed. Each contact hole 50 penetrates through the corresponding conductive layer WL1-WL4 by the amount of one layer, and its bottom is stopped in the underlying dielectric layer 17 without reaching other conductive layers therebelow.

In this embodiment, as described above, between the silicon oxide-based layers, a heterogeneous, silicon nitride-based layer is interposed so that process variation between holes has been reduced at the stage before etching for penetrating through the conductive layers WL1-WL4. Thus, difference in etching amount between the conductive layers WL1-WL4 at the stage of FIG. 9B can be reduced. Hence, even if etching for penetrating through the conductive layers WL1-WL4 is subsequently performed, shallower contact holes 50 can be prevented from reaching other conductive layers therebelow.

After the aforementioned contact holes 50 are formed, the organic film 43 serving as a mask material is removed. Subsequently, as a preprocess for contact electrode formation, a treatment with chemicals such as hydrofluoric acid and hydrogen sulfide is performed to remove natural oxide film, post-RIE residues, and contaminants attached during atmospheric transport on the bottom of the contact holes 50.

Figure 10B:
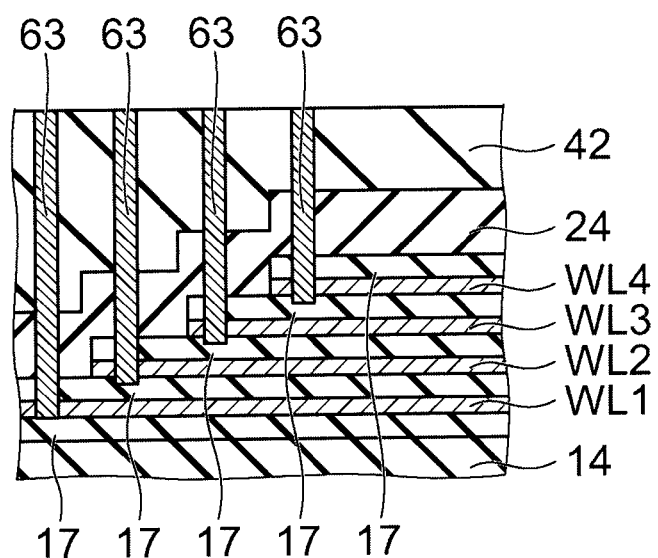

Subsequently, a metal film for forming silicide, such as a titanium film, is formed on the bottom and sidewall of the contact hole 50, and a titanium nitride film covering it is further formed, each by the CVD method. After these films are formed, the titanium film is reacted by heat treatment with silicon of the conductive layers WL1-WL4 to form titanium silicide ($TiSi_2$) on the sidewall portion of the conductive layers WL1-WL4 in contact with the titanium film, thereby reducing the resistance. Next, tungsten, for instance, is buried in the contact hole 50 by the CVD method to form a contact electrode 63 as shown in FIG. 10B.

Figure 11:
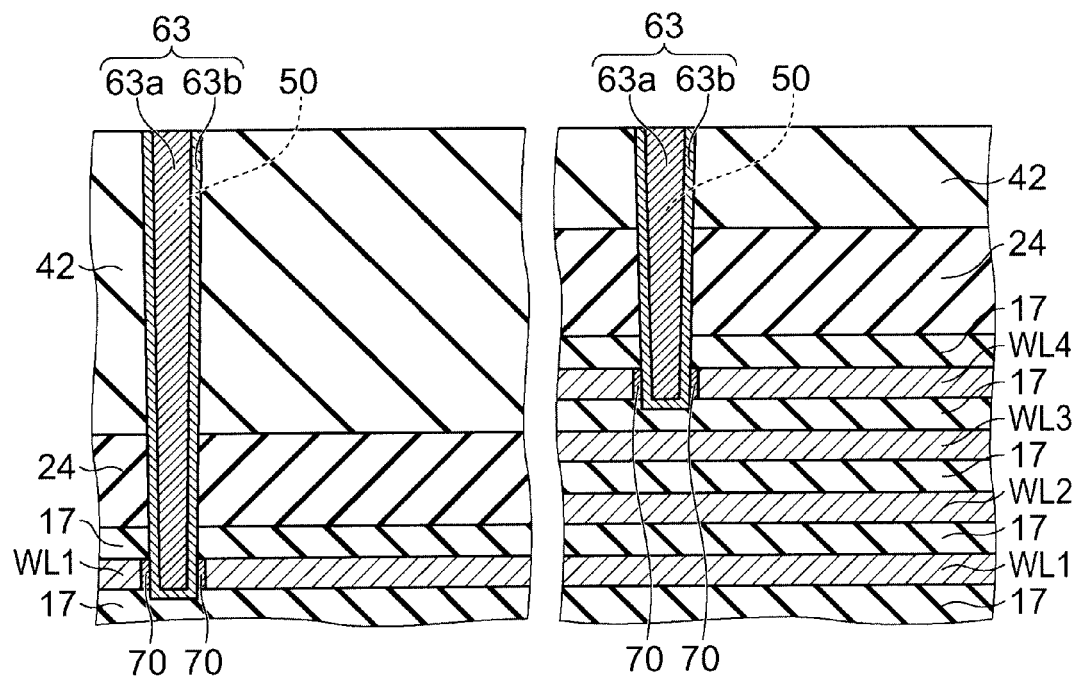
FIG. 11 is a schematic view of the principal portion in the semiconductor device according to the embodiment of the invention.

FIG. 11 schematically shows, for instance, a contact hole 50 reaching and penetrating the lowermost conductive layer WL1 and a contact electrode 63 buried therein, and a contact hole 50 reaching and penetrating the uppermost conductive layer WL4 and a contact electrode 63 buried therein.

The contact electrode 63 includes the aforementioned titanium or other conductive film 63b formed on the bottom and sidewall of the contact hole 50, and a tungsten or other conductive material 63a buried therein. Each conductive layer WL1-WL4 is in contact with the contact electrode 63 only at the sidewall portion 70 exposed into the contact hole 50 so as to surround the contact hole 50 penetrating therethrough, and that portion is turned into titanium silicide. The upper end portion of each contact electrode 63 is connected to the word line WLL as shown in FIG. 1, and each conductive layer WL1-WL4 is electrically connected to the word line WLL through the contact electrode 63.

According to this embodiment, the contact holes 50 reaching the staircase-shaped conductive layers WL1-WL4 are formed so as to penetrate through the conductive layers WL1-WL4. Hence, the bottom of the contact electrode 63 provided in the contact hole 50 is not in contact with the corresponding conductive layer WL1-WL4, but each conductive layer WL1-WL4 is in contact with the contact electrode 63 only at the sidewall portion 70. Furthermore, the conductive layers WL1-WL4 are formed to a generally equal thickness. Hence, the contact area of the conductive layer WL1-WL4 with the contact electrode 63 can be made nearly equal between the conductive layers WL1-WL4, and variation in contact resistance to the contact electrode 63 can be reduced between the conductive layers WL1-WL4. Consequently, variation in characteristics can be reduced between the memory cells with the conductive layers WL1-WL4 serving as control gates.

Here, as in the comparative example shown in FIG. 12, even if the contact electrode 80 is brought into contact with the corresponding conductive layer WL1-WL4 at the bottom of the contact hole, the surface of the conductive layer WL1-WL4 exposed to the contact hole bottom is damaged by ions implanted during RIE, and the silicide reaction is less likely to occur in that portion. Hence, contact of the contact electrode 80 with the corresponding conductive layer WL1-WL4 at the contact hole bottom does not significantly contribute to reducing the contact resistance therebetween.

On the other hand, the sidewall portion 70 of the conductive layers WL1-WL4 exposed to the sidewall of the contact hole 50 is less likely to be hit by ions during RIE, and less likely to be damaged. Hence, the silicide reaction is facilitated in the sidewall portion 70, and the contact resistance to the contact electrode 63 can be reduced. Consequently, variation in contact resistance to the contact electrode 63 between the conductive layers WL1-WL4 can be reduced more significantly in the structure where the conductive layer WL1-WL4 is in contact with the contact electrode 63 only at its sidewall portion 70.

Furthermore, the aforementioned process for forming contact holes 50 by successively etching the layers from the top layer can be continuously performed in the same chamber by simply switching gas species, flow rate and the like to improve the processing efficiency.

The embodiment of the invention has been described with reference to examples. However, the invention is not limited thereto, but can be variously modified within the spirit of the invention.

The shape of the silicon pillar in the memory cell array is not limited to a cylinder, but can be a prism. Furthermore, the invention is not limited to burying columnar silicon entirely in the memory hole. As an alternative structure, a silicon film can be formed in a tubular shape only at the portion in contact with the dielectric film including the charge storage layer, and a dielectric can be buried inside it. Furthermore, the dielectric film structure between the conductive layer and the silicon pillar is not limited to the ONO (oxide-nitride-oxide) structure, but can be a two-layer structure of a charge storage layer and a gate dielectric film, for instance.

The invention claimed is:

1. A semiconductor device comprising:
    a stacked body with a plurality of conductive layers and a plurality of dielectric layers alternately stacked therein, the stacked body including a staircase structure having the plurality of conductive layers processed into a staircase shape;
    an interlayer dielectric layer covering the staircase structure; and
    a contact electrode provided inside a contact hole penetrating through the interlayer dielectric layer, the contact hole penetrating through one of the staircase-shaped conductive layers, the contact electrode being in contact with a sidewall portion of the one of the staircase-shaped conductive layers exposed into the contact hole.

2. The device according to claim 1, wherein the plurality of conductive layers have a generally equal thickness.

3. The device according to claim 1, wherein a bottom of the contact hole does not reach the other conductive layers below the one of the staircase-shaped conductive layers penetrated by the contact hole.

4. The device according to claim 1, wherein the sidewall portion of the one of the staircase-shaped conductive layers surrounds the contact electrode.

5. The device according to claim 1, wherein the contact electrode includes a metal film formed on a bottom and sidewall of the contact hole and a conductive material buried inside the metal film.

6. The device according to claim 1, further comprising:
    a semiconductor layer provided inside a memory hole penetrating through the stacked body, the semiconductor layer extending in the stacking direction of the conductive layers and the dielectric layers; and
    a charge storage layer provided between the conductive layers and the semiconductor layer.

7. The device according to claim 6, further comprising:
    a first dielectric film provided between the conductive layers and the charge storage layer; and
    a second dielectric film provided between the charge storage layer and the semiconductor layer.

8. The device according to claim 6, wherein the semiconductor layer includes silicon.

9. The device according to claim 6, wherein the conductive layers include silicon.

10. The device according to claim 9, wherein the sidewall portion of the one of the staircase-shaped conductive layers includes a metal silicide.

11. The device according to claim 1, wherein the dielectric layers include silicon oxide.

12. The device according to claim 11, wherein
    a surface layer of the staircase structure is one of the dielectric layers, and
    the interlayer dielectric layer includes a silicon oxide layer provided above the surface layer of the staircase structure via a silicon nitride layer.

* * * * *